(12) United States Patent
Ryu

(10) Patent No.: US 7,829,371 B2
(45) Date of Patent: Nov. 9, 2010

(54) IMAGE SENSOR AND METHOD FOR MANUFACTURING THE SAME

(75) Inventor: Sang-Wook Ryu, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 99 days.

(21) Appl. No.: 12/046,091

(22) Filed: Mar. 11, 2008

(65) Prior Publication Data
US 2008/0224245 A1    Sep. 18, 2008

(30) Foreign Application Priority Data
Mar. 14, 2007    (KR) ..................... 10-2007-0024919

(51) Int. Cl.
*H01L 21/00*    (2006.01)
(52) U.S. Cl. .................. 438/70; 257/E31.001; 257/432; 257/435; 438/48; 438/65
(58) Field of Classification Search .................... 438/70
See application file for complete search history.

(56) References Cited

U.S. PATENT DOCUMENTS

2004/0027680 A1*  2/2004  Ozawa ....................... 359/642
2005/0101043 A1*  5/2005  Chen et al. ..................... 438/30
2005/0250241 A1   11/2005 Hong
2006/0012001 A1*  1/2006  Kim .......................... 257/432
2006/0145197 A1   7/2006  Baek
2006/0292734 A1   12/2006 Kim

FOREIGN PATENT DOCUMENTS

| CN | 1694259 | 11/2005 |
|----|---------|---------|
| CN | 1819248 | 8/2006 |
| CN | 1893025 | 1/2007 |
| JP | 2006-351761 | 12/2006 |
| KR | 10-2005-0057968 | 6/2005 |
| KR | 10-2007-0023027 | 2/2007 |

* cited by examiner

*Primary Examiner*—Ajay K Arora
(74) *Attorney, Agent, or Firm*—Sherr & Vaughn, PLLC

(57) ABSTRACT

An image sensor including an interlayer dielectric layer formed over a semiconductor substrate, a color filter layer formed over the interlayer dielectric layer, a planarization layer formed over the color filter, and a microlens array having a gapless, continuous shape and a multilayered structure formed over the planarization layer.

14 Claims, 3 Drawing Sheets

IMAGE SENSOR AND METHOD FOR MANUFACTURING THE SAME

Figure 1:
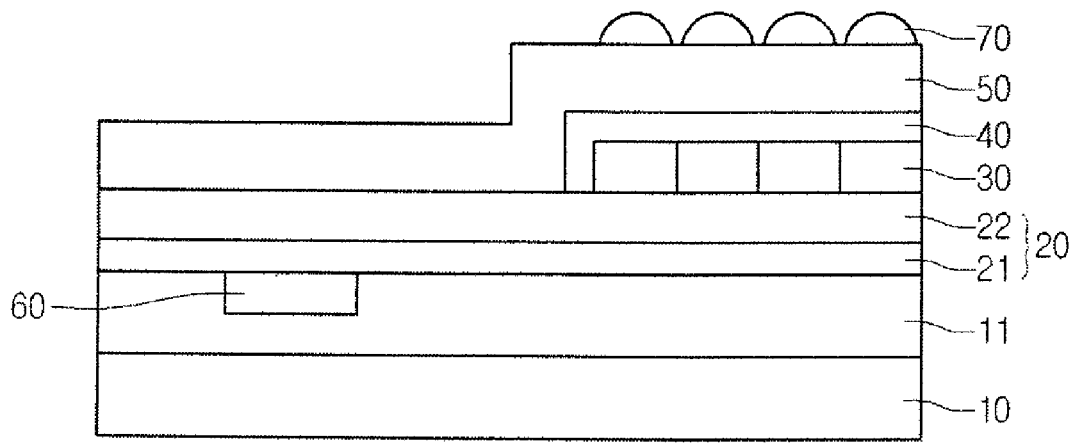

The present application claims priority under 35 U.S.C. 119 and 35 U.S.C. 365 to Korean Patent Application No. 10-2007-0024919 (filed on Mar. 14, 2007), which is hereby incorporated by reference in its entirety.

BACKGROUND

A CMOS image sensor may include a photodiode and a MOS transistor within a unit pixel for sequentially detecting electrical signals of each unit pixel, implementing an image.

Among manufacturing processes of the CMOS image sensor, a method forming a microlens may be formed by patterning and then reflowing an organic photoresist for microlens. When the organic photoresist is patterned, it is preferable that a gapless microlens is formed by keeping a predetermined interval. However, when using an organic photoresist, a bridge phenomenon may occur where it is attached to the adjacent microlens in the reflow process.

SUMMARY

Embodiments relate to an image sensor and a method for manufacturing the same that can enhance the rate of condensing light by forming a microlens array having a gapless shape.

Embodiments relate to an image sensor that can include at least one of the following: a semiconductor substrate; an interlayer dielectric layer formed over the semiconductor substrate; a color filter layer formed over the interlayer dielectric layer; a planarization layer formed over the color filter; and a microlens array having a multilayered structure formed over the planarization layer including a gapless, continuous shape.

Embodiments relate to method for manufacturing an image sensor that can include at least one of the following steps: forming an interlayer dielectric layer over a semiconductor substrate formed; sequentially forming a color filter layer and a planarization layer over the interlayer dielectric layer; forming a plurality of seed microlenses spaced apart over the planarization layer; and then forming a microlens array having a gapless, continuous shape by forming a second dielectric layer over the plurality of seed microlenses and in spaces between neighboring seed microlenses.

Embodiments relate to an image sensor that can include at least one of the following steps: forming an interlayer dielectric layer having a pad region including a metal pad over a semiconductor substrate; forming a color filter layer over the interlayer dielectric layer; forming a planarization layer over the color filter; forming a microlens array having a multilayered structure over the planarization layer, wherein the microlens array has a gapless, continuous shape; and then exposing the metal pad.

DRAWINGS

Example FIGS. 1 to 5 illustrate a method of manufacturing an image sensor, in accordance with embodiments.

DESCRIPTION

As illustrated in example FIGS. 1-5, an image sensor in accordance with embodiments can include interlayer dielectric layer 11 formed on and/or over semiconductor substrate 10 having a photo sensor including a photodiode. Interlayer dielectric layer 11 can include a metal wire extending therethrough having a final metal wire for electrical connection with the external, i.e., pad 60.

Passivation layer 20 for protecting a device can be formed on and/or over pad 60. Passivation layer 20 can be formed as a multilayered stacked structure and composed of at least one of a silicon oxide film, a silicon nitride film and a silicon oxynitride film. For example, passivation layer 20 can be formed having a multilayered stacked structure including a lower film such as TEOS film 21 having a thickness of between approximately 1,000 to 5,000 Å and an upper film such as nitride film 22 having a thickness of between approximately 1,000 to 10,000 Å.

Color filter 30 can be formed on and/or over passivation layer 20 and planarization layer 40 for complementing a step of color filter 30 can then be formed on and/or over color filter 30.

Seed microlens array 51 having a plurality of seed microlenses formed in a hemispherical or dome shape can then be formed on and/or over planarization layer 40. In microlens array 51 each seed microlens can be formed spaced apart from or in direct with a neighboring seed microlens. Seed microlens array 51 can be formed by depositing first dielectric layer 50 and be composed of at least one of an oxide film, a nitride film, and an oxynitride film. For example, seed microlens array 51 can be composed of an oxide film having a thickness of between approximately 2,000 to 6,000 Å.

Second dielectric layer 53 can then be formed on and/or over seed microlens array 51. Second dielectric layer 53 can be formed as a multilayer stacked structure and be composed of at least one of an oxide film, a nitride film and an oxynitride film. For example, second dielectric layer 53 can be composed of an oxide film having a thickness of between approximately 500 to 20,000 Å.

Zero-gap microlens array 55 can then be formed using seed microlens array 51 and second dielectric layer 53. Microlens array 55 can be formed to include seed microlens 51 and second dielectric layer 53 to have a continuous, embossed shape. Microlens array 55 having a gapless shape can be formed using seed microlens array 51 and second dielectric layer 53 to reduce the gap of microlens array 55 to a zero-gap level, thus making it possible to improve a light-condensing rate of the image sensor by reducing loss of the light incident on microlens array 55.

Microlens array 55 can be formed in a continuous embossed shape having the same focal distance from all directions, thus making it possible to improve quality of the image sensor.

After formation of microlens array 55, passivation layer 20, first dielectric layer 50 and second dielectric layer 53 on and/or over pad 60 can then be etched to create hole 61 exposing at least a portion of the uppermost surface of form a pad 60.

A method of forming such an image sensor can now be described. As illustrated in example FIG. 1, a photosensor including a photodiode can be formed on and/or over semiconductor substrate 10. The photosensor including the photodiode, a device isolation film defining an active region and a filed region can be formed on and/or over semiconductor substrate 10. The photodiode and an accompanying transistor connected thereto can be formed in each unit pixel of semiconductor substrate 10. The photodiode can serve to receive light and generate a photocharge that is transmitted to the transistor which converts the received photocharge into an electrical signal.

After relevant devices including the device isolation film and the photodiode are formed, interlayer dielectric layer 11 including a metal wire can then be formed on and/or over semiconductor substrate 10. Such a metal wire may be formed to be intentionally laid-out not to shade light incident on and/or over the photodiode. Also, interlayer dielectric layer 11 including the metal wire can be formed having a multilayered structure.

Passivation layer 20 can then be formed on and/or over interlayer dielectric layer 11 for protecting a device from moisture, scratches, etc. Passivation layer 20 can be formed after formation of final metal wire, i.e., pad 60. Passivation layer 20 can be formed having a multilayered, stacked structure and/or be composed of at least one of a silicon oxide film, a silicon nitride film and a silicon oxynitride film.

For example, passivation layer 20 can be formed having a multilayered stacked structure including a lower film such as TEOS film 21 having a thickness of between approximately 1,000 to 5,000 Å and an upper film such as nitride film 22 having a thickness of between approximately 1,000 to 10,000 Å.

Color filter 30 can then be formed on and/or over interlayer dielectric layer 11 formed with pad 60, either with or without passivation layer 20. Formation of color filter 30 directly on and/or over interlayer dielectric layer 11 can reduce the overall thickness and size of the image sensor.

A first process forming a hole to expose at least a portion of the uppermost surface of pad 60 can be performed on passivation layer 20. This process can involve forming a photoresist pattern having a hole corresponding to pad 60 region on and/or over passivation layer 20 and etching passivation layer 20 using the photoresist pattern as an etching mask to expose pad 60.

Microlens array 55 can then be formed and a second pad process may be progressed again. Herein, the first pad open process can be omitted. Hereinafter, the case where the first pad open process is omitted will be described by way of example.

As illustrated in example FIG. 1, color filter 30 can be formed on and/or over passivation layer 20 and include a plurality of filters having three colors such as, red, green and blue for implementing a color image. Color filter 30 can be composed of dyed photoresists such that each color filter is formed in each unit pixel to classify colors from the light incident. Color filter 30 can be formed such that adjacent color filters 30 are somewhat overlapped with each other having a stepped formation.

Planarization layer 40 can then be formed on and/or over color filter 30. A microlens array to be formed by a subsequent process can be formed on and/or over the planarized surface. The step due to color filter 30 should be removed so that planarization layer 40 can be formed on and/or over color filter 30. In the case where planarization layer 40 is formed on and/or over color filter 30 will be described by way of example.

First dielectric layer 50 and microlens array mask 70 for forming a microlens array can be formed on and/or over an uppermost surface of planarization layer 40. First dielectric layer 50 can be composed of at least one of an oxide film, a nitride film and an oxynitride film. For example, first dielectric layer 50 can be composed of an oxide film such as $SiO_2$ having a thickness of between approximately 2,000 to 20,000 Å at a temperature of about 50 to 250° C. The oxide film can be formed using CVD, PVD, and PEDVD, etc. Microlens array mask 70 can then be formed through processes applying a photoresist film on and/or over first dielectric layer 50, patterning it and then performing a reflow thereon.

Figure 2:
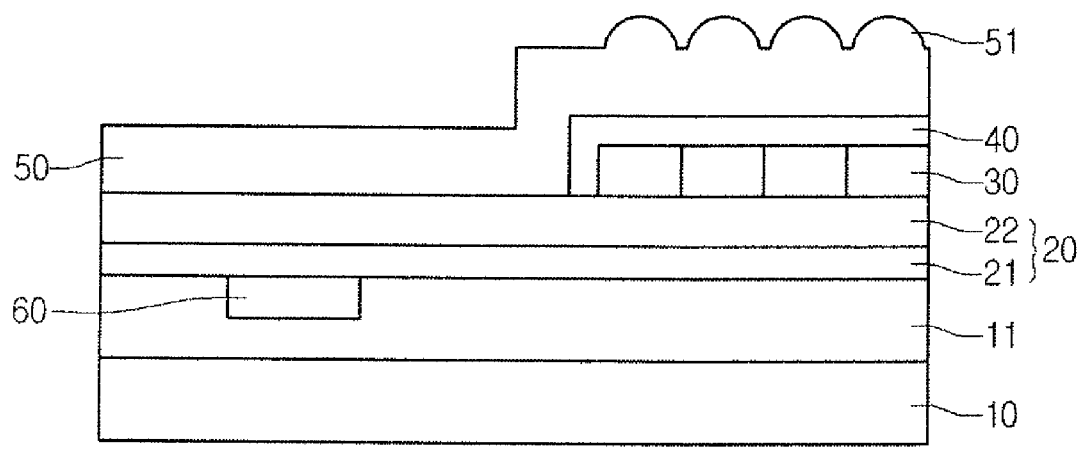

As illustrated in example FIG. 2, after formation of microlens array mask 70, an etching process for first dielectric layer 50 can be performed using microlens array mask 70 as an etching mask to form seed microlens 51. The etching of first dielectric layer 50 can be performed so that an etching for the photoresist film forming microlens array mask 70 and the oxide film forming first dielectric layer 50 can be performed at an etching selection ratio of between 1:0.7 to 1.3. Therefore, the etching of first dielectric layer 50 for forming seed microlens 51 can be performed until the photoresist film forming microlens array mask 70 is completely etched. The etching process of first dielectric layer 50 can be done using an etching gas composed of $C_xH_yF_z$ (x, y, and z are 0 or natural numbers) kind and an inert gas such as at least one of Ar, He, $O_2$ and $N_2$. For example, the etching gas may use $CF_4$ gas of 40 to 120 sccm, and either $O_2$ gas of 2 to 20 sccm or Ar gas of 200 to 900 sccm.

Therefore, first dielectric layer 50 can be etched through the etching process to enable formation of seed microlens array 51. For example, first dielectric layer 50 can be etched to a thickness of between approximately 1,000 to 19,000 Å. A thickness of seed microlens array 51 can be formed at between approximately 2,000 to 6,000 Å.

As illustrated in example FIG. 2, seed microlens array 51 having a plurality of seed microlenses having a dome, i.e., hemspherical shape can be formed on and/or over color filter 30. Seed microlens array 51 can be formed such that an individual seed microlens directly contacts or is spaced apart from a neighboring seed microlens in view of its edge. If an edge or a step of a seed microlens contacts an edge or a step of a neighboring seed microlens, a gap between the seed microlenses can be removed so that a loss of light incident on the microlenses is reduced, making it possible to improve a light-condensing rate.

Figure 3:
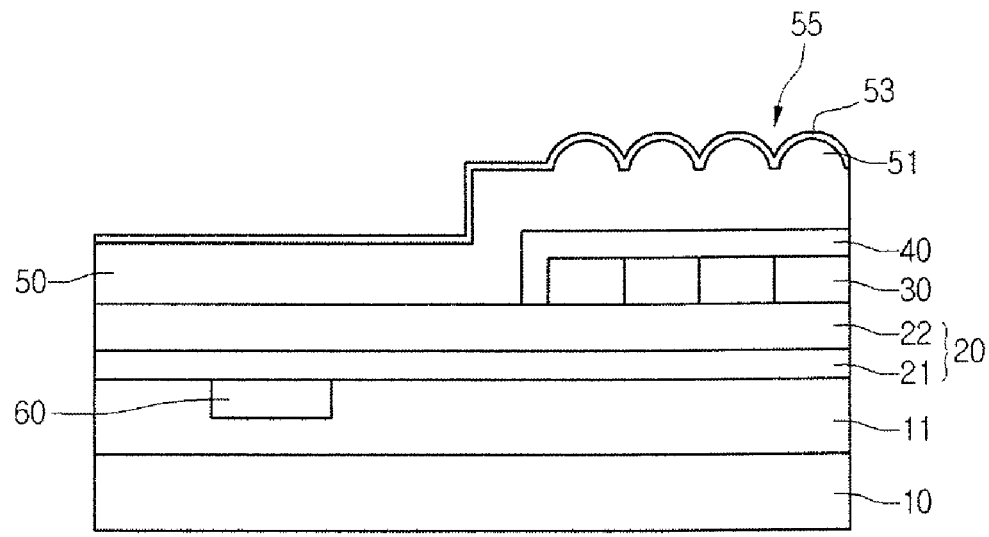

On the other hand, as illustrated in example FIG. 3, in seed microlens array 51, if a step of a seed microlens is spaced from a step of the neighboring seed microlens, a gap between neighboring microlenses can be formed so that there is a concern to incur a loss in the light incident thereby.

Accordingly, in order to prevent this, microlens array 55 can be formed having a gapless shape which contacts a step of seed microlens array 51. Microlens array 55 can be formed by depositing second dielectric layer 53 on and/or over seed microlens array 51. As illustrated in example FIG. 3, second dielectric layer 53 can be formed on and/or over first dielectric layer 50 including seed microlenses 51. Second dielectric layer 53 can be composed of the same substance as first dielectric layer 50. For example, second dielectric layer 53 can be composed of an oxide film having a thickness of between approximately 500 to 20,000 Å at a temperature of between 50 to 250° C. Second dielectric layer 53 can be formed to entirely fill the gap between neighboring seed microlens 51.

As illustrated in example FIG. 3, if second dielectric layer 53 is formed on and/or over seed microlens array 51 to form microlens array 55, thereby removing a gap between neighboring seed microlenses of the seed microlens array 51. Accordingly, microlens array 55 having a gapless shape can be formed in a continuous, embossed shape where an edge of one microlens is not broken with an edge of a neighboring microlens. Therefore, a gap between individual microlenses in microlens array 55 becomes a zero gap, having an effect capable of improving quality of the image sensor.

In particular, microlens array 55 can be formed by depositing second dielectric layer 53 on and/or over seed microlens array 51 to have a more bulging dome shape. Microlens array 55 can be formed having a plurality of microlenses such that an individual microlens directly contacts a neighboring microlens, thereby providing microlens array 55 having a continuous, embossed shape. In other words, the bottom surface thereof is formed in a quadrangle shape and the upper surface thereof is formed in a bulging dome shape so that microlens array 55, having a hemispherical cross-section, has a continuous shape. Such microlens array 55 formed in accordance with embodiments can improve a light-condensing rate of incident light.

Figure 4:
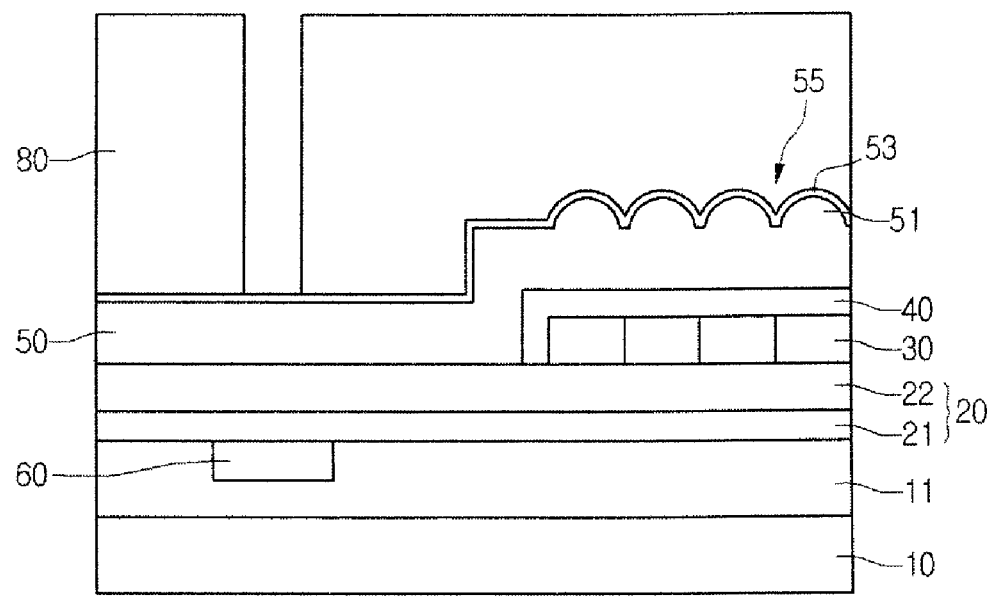

As illustrated in example FIG. 4, pad mask 80 is formed on and/or over microlens array 55 exposing a region of microlens array 55 corresponding to the pad region for opening pad 60. Pad mask 80 can be formed by patterning a photoresist film. Hole 61 can be formed by an etching process using pad mask 80 as an etching mask to thereby remove second dielectric layer 53, first dielectric layer 50 and passivation layer 20 corresponding to the uppermost surface of pad 60. A region of the uppermost surface of pad 60 can then be exposed by hole 61. The formation of hole 61 can be performed using an etching gas composed of $C_xH_yF_z$ (x, y, and z are 0 or natural numbers) and an inert gas such as at least one of Ar, He, $O_2$ and $N_2$.

Figure 5:
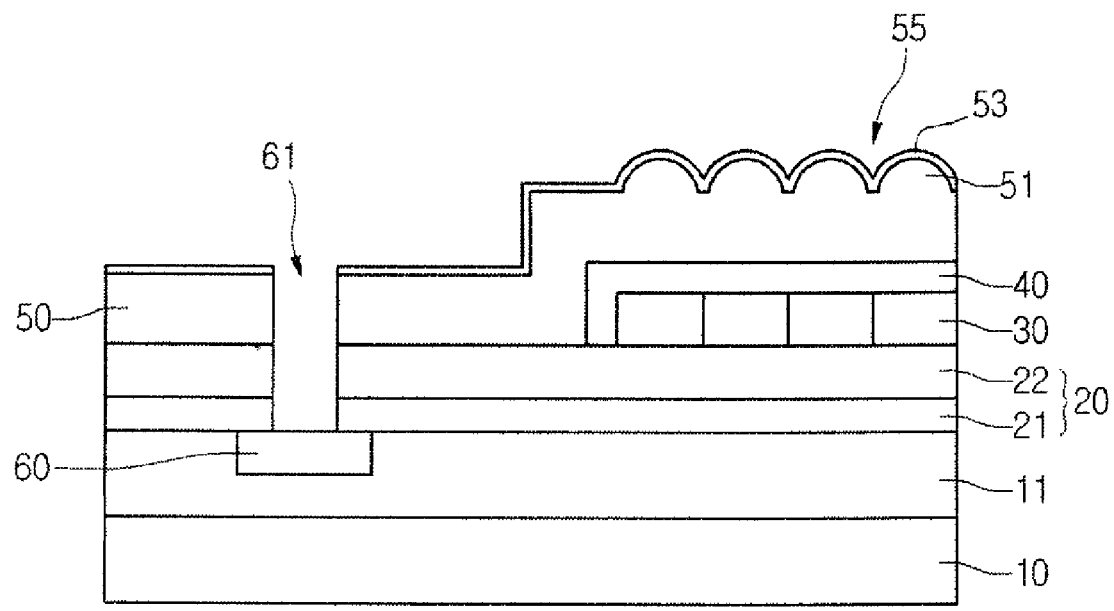

As illustrated in example FIG. 5, pad mask 80 remained on and/or over second dielectric layer 53 can then be removed to complete the process.

In accordance with embodiments, an image sensor and a method for manufacturing is provided such that a seed microlens array having a dome shape can be formed using a first dielectric layer and then, a second dielectric layer can be formed on and/or over the seed microlens array. Accordingly, it is possible to form a microlens array in an embossed shape. In particular, the microlens array can be formed in a gapless shape to reduce a loss of incident light, making it possible to improve a light-condensing rate. Also, a plurality of microlens of the microlens array can be formed in a continuous embossed shape to have the same focal distance from all directions, thus making it possible to improve a light-condensing rate. The microlens array in accordance with embodiments can be formed as an inorganic, hard microlens composed of an oxide film, thus making it possible to prevent image defects possibly generated from an impact or a particle, etc., during a subsequent package or bump process.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming an interlayer dielectric layer over a semiconductor substrate formed;
    sequentially forming a color filter layer and a planarization layer over the interlayer dielectric layer;
    forming a seed microlens array including a plurality of seed microlenses formed spaced apart over the planarization layer; and then
    forming a microlens array having a gapless, continuous shape by forming a second dielectric layer over the plurality of seed microlenses and in spaces between neighboring seed microlenses,
    wherein the step of forming the seed microlens array comprises:
        forming a first dielectric layer over the planarization layer;
        forming a plurality of microlens masks each having a hemispherical shape over the first dielectric layer; and then
        etching the first dielectric layer using the microlens masks as etching masks.

2. The method of claim 1, wherein etching the first dielectric layer is performed using a mixture of at least one of Carbon, Hydrogen and Fluorine and at least one of Ar, He, $O_2$ and $N_2$.

3. The method of claim 1, wherein etching the first dielectric layer is performed using $CF_4$ gas of 40 to 120 sccm, and at least one of $O_2$ gas of between 2 to 20 sccm and Ar gas of between 200 to 900 sccm.

4. The method of claim 1, wherein the first dielectric layer and the second dielectric layer are composed of at least one of an oxide film, a nitride film, and an oxynitride film.

5. The method of claim 4, wherein the first dielectric layer and the second dielectric layer are formed at a temperature of between 50 to 250° C.

6. The method of claim 1, wherein an etching selection ratio between the microlens masks and the first dielectric layer is between 1:0.7 to 1.3.

7. The method of claim 1, wherein the plurality of seed microlenses is each formed at a thickness of between approximately 2,000 to 6,000 Å.

8. The method of claim 1, wherein the second dielectric layer is formed at a height of between approximately 500 to 20,000 Å.

9. The method of claim 1, wherein the first dielectric layer is etched to a thickness of between approximately 1,000 to 19,000 Å.

10. The method of claim 1, wherein the microlens masks is formed having a hemispherical shape.

11. The method of claim 1, wherein each of the plurality of microlens masks forms each of the plurality of seed microlenses by said etching the first dielectric layer using the microlens masks as etching masks.

12. A method comprising:
    forming an interlayer dielectric layer having a pad region including a metal pad over a semiconductor substrate;
    forming a color filter layer over the interlayer dielectric layer;
    forming a planarization layer over the color filter;
    forming a microlens array having a multilayered structure over the planarization layer, wherein the microlens array has a gapless, continuous shape; and then exposing the metal pad,
wherein the step of forming the seed microlens array comprises:
forming a first dielectric layer over the planarization layer;
forming a plurality of microlens masks each having a hemispherical shape over the first dielectric layer; and then
etching the first dielectric layer using the microlens masks as etching masks.

13. The method of claim 12, wherein the first dielectric layer and the second dielectric layer each comprises at least one of an oxide film, a nitride film and an oxynitride film.

14. The method of claim 12, wherein each of the plurality of microlens masks forms each of the plurality of seed microlenses by said etching the first dielectric layer using the microlens masks as etching masks.

* * * * *